United States Patent
Terao

(10) Patent No.: US 6,348,789 B1
(45) Date of Patent: *Feb. 19, 2002

(54) TESTBOARD FOR IC TESTER

(75) Inventor: Masashi Terao, Tokyo (JP)

(73) Assignee: Ando Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/897,111

(22) Filed: Jul. 18, 1997

(30) Foreign Application Priority Data

Jul. 31, 1996 (JP) .............................................. 8-219394

(51) Int. Cl.⁷ .............................................. G01R 31/02
(52) U.S. Cl. ...................... 324/158.1; 324/754; 324/761
(58) Field of Search .............................. 324/158.1, 754, 324/761, 755; 439/3

(56) References Cited

U.S. PATENT DOCUMENTS

| | | | | |
|---|---|---|---|---|
| 3,274,534 A | * | 9/1966 | Shortridge | 324/761 |
| 4,517,512 A | * | 5/1985 | Petrich et al. | 324/754 |
| 4,996,478 A | * | 2/1991 | Pope | 324/754 |
| 5,055,777 A | * | 10/1991 | Bonelli et al. | 324/754 |
| 5,126,657 A | * | 6/1992 | Nelson | 324/761 |
| 5,247,246 A | * | 9/1993 | Van Loan et al. | 324/761 |

FOREIGN PATENT DOCUMENTS

| | | | | | |
|---|---|---|---|---|---|
| JP | 04025777 A | * | 1/1992 | ........... | G01R/31/26 |
| JP | 4-21881 | | 2/1992 | | |
| JP | 04169874 A | * | 6/1992 | ........... | G01R/31/28 |
| JP | 4-289467 | | 10/1992 | | |
| JP | 06267629 A | * | 9/1994 | ........... | G01R/31/26 |
| JP | 07012889 A | * | 1/1995 | ........... | G01R/31/26 |
| JP | 7-92232 | | 7/1995 | | |
| JP | 8-129048 | | 5/1996 | | |
| JP | 10185990 A | * | 7/1998 | ........... | G01R/31/26 |
| JP | 11083934 A | * | 3/1999 | ........... | G01R/31/26 |

* cited by examiner

Primary Examiner—Safet Metjahic
Assistant Examiner—Jermele Hollington
(74) Attorney, Agent, or Firm—Darby & Darby

(57) ABSTRACT

A testboard provides an interface between an IC tester and a device (16) being tested has a base unit (21) and a DUT unit (22). The base unit (21) has a plurality of connectors (24) each on a separate base card (25) which are to engage respective connectors (23) on a pin card (3) of the IC tester and a plurality cable harnesses (27) each having a connector (26) for the wires at one of its ends to be connected to a selected one of the connector (24). The DUT unit (22) has a socket board (14) with an IC socket (15) to accept the IC device (16) being tested and a plurality of connectors (29) engaged by separate second connectors (28) on the other end of the wires of a cable harness (27). A post housing and post connector (26a, 26b) can be provided at the connector of each base card to interchange the electrical connections between the connector at the end of a cable harness and the connector of a base card.

2 Claims, 6 Drawing Sheets

TESTBOARD FOR IC TESTER

BACKGROUND OF THE INVENTION

1. Technical Field of the Invention

The present invention relates to a testboard for an IC tester and, in particular, to a testboard for an IC tester which connects an IC tester and an auto-handler.

2. Background Art

Testboards for IC testers lie between a device 16 being tested and a pin card 3, comprise a base unit 1 and a DUT unit 2 as shown in FIGS. 4–6 and are used to connect an IC tester and an auto-handler. FIGS. 4A and 4B are structural diagrams of the conventional art, FIG. 5 is a perspective view of the conventional art, and FIG. 6 is a diagram showing a view of the conventional art as seen from the direction of arrow VI of FIG. 5.

In FIGS. 4A and 4B, base unit 1 comprises base board 5 on which first connector 6 is mounted, and cable harness 8 which has a second connector 7 and a third connector 9 at respective ends.

Pogo pin 4 is mounted on pin card 3 and base board 5 is connected to pin card 3 by pressing (as indicated by the arrow E in the figure) pogo pin 4 into a pogo pin connector (omitted from the figure) which is provided on the lower surface of the base board 5. First connector 6 is mounted on base board 5, and first connector 6 engages second connector 7 of cable harness 8.

On the other hand, DUT unit 2 comprises connector card 11 on which fourth connector 10 is mounted, socket board 14 on which IC socket 15 is mounted, and cable 13 which is connected between connector card 11 and socket board 14. As indicated by the numbers 12 in FIG. 4A, one end of cable 13 which is a component of DUT unit 2 is connected to connector 11 and the other end is connected to socket board 14.

By means of this structure, it is possible to exchange DUT unit 2 so as to correspond with the different varieties of device 16 to be measured, by separating the base unit 1 and the DUT unit 2 between the third connector 9 and the fourth connector 10 (as indicated by the arrow C in FIG. 4B).

In addition, it is possible to conduct maintenance on pin card 3 and first connector 6 by means of separating pin card 3 and base unit 1 between pogo pin 4 and pogo pin connector (omitted from the Figure) (at the position indicated by the arrow D in FIG. 4B).

Furthermore, by means of using cable 13 which is a component of DUT 2, it is possible to change the signal destination, and thereby obtain correspondence for a variety of different devices 16 being tested.

However, the above-mentioned conventional testboard for an IC tester has, for example, the following problems.

(1) The conventional DUT unit 2 comprises connector card 11 on which fourth connector 10 is mounted, socket board 14 on which IC socket 15 is mounted, and cable 13 which is connected to connector card 11 and socket board 14 by means of solder. The unit modulated in this way is housed in the box 17 as shown in FIG. 5 and FIG. 6, and thereby the DUT unit 2 is constructed.

Consequently, the DUT unit 2 is large, heavy and difficult to construct, as a result, separation and exchange is not easy, and, for example, separation and exchange require many people.

(2) As shown in FIG. 4B and FIG. 6, first connector 6 is mounted on base board 5 which extends over the whole of base unit 1. Therefore, when carrying out maintenance of the base unit 1, exchange of the first connector 6 which is mounted on this kind of large base board 5 requires time and effort and is not simple.

(3) The connection of connector card 11 with socket board 14 which is a component of DUT unit 2 is by means of cable 13 which is connected at both ends by means of solder, and, in addition, the connection of base board 5 which is a component of base unit 1 with pin card 3 is conducted by means of pogo pin 4 (FIG. 4 and FIG. 6). Consequently, in the signal system, there are a large number of connection points like pogo pin 4 and solder connection 12, and it is difficult to realize, in particular, high speed transmission of high frequency signals. As a result, the reliability and transmittability of high frequencies is reduced.

(4) In order to obtain correspondence with a variety of different devices 16 being tested, it is necessary to change the arrangement of connecting signals.

DISCLOSURE OF THE INVENTION

An object of the present invention is the provision of a testboard for an IC tester for which it is simple to separate and exchange the DUT unit in accordance with different devices being tested, the maintainability of the base unit is improved, the reliability and transmittability of high frequency signals at connection points are improved, and, in addition, which uses a cable harness for which the arrangement of connecting signal can be changed.

In order to solve the above-mentioned problems, as shown in FIGS. 1 through 3, the present invention is a testboard for an IC tester which comprises a base unit and a DUT unit, and lies between the device being tested and a pin card.

In the present invention, the above-mentioned base unit 21 of the testboard for an IC tester comprises sixth connector 24 which engages fifth connector 23 which is mounted on pin card 3; base card 25 on which sixth connector 24 is mounted and which is divided into sections, one for each sixth connector 24; and cable harness 27 which comprises seventh connector 26 and eighth connector 28 at respective ends, and for which the connection destination in which seventh connector 26 engages sixth connector 24 which is mounted on the above-mentioned base card 25 is changeable.

The above-mentioned DUT unit 22 comprises socket board 14 on which ninth connector 29 which engages eighth connector 28 of cable harness 27 is mounted; and which comprises IC socket 15.

By means of the present invention, since the DUT unit 22 comprises only socket board 14 and does not have a cable arrangement, the DUT unit 22 can be small and light weight, construction is easy, separation and exchange of the DUT unit is simple, and by means of a socket board 14 having a different pattern, it is possible to achieve correspondence for a variety of different devices 16 being measured.

In addition, since sixth connector 24 is mounted on base card 25 which is divided, the maintainability of base unit 21 is improved, and pogo pins and solder connections 12 are unnecessary, therefore, connection points are reduced and the reliability and transmittability of high frequency signals is improved. Furthermore, since connections are made via cable harness 27 for which it is possible to change connection destinations between socket board 14 and pin card 3, it is possible to change the arrangement of connecting signals.

BEST MODE FOR CARRYING OUT THE INVENTION

Embodiment

In the following, an embodiment of the present invention is explained with reference to the appended drawings.

Figure 1A:
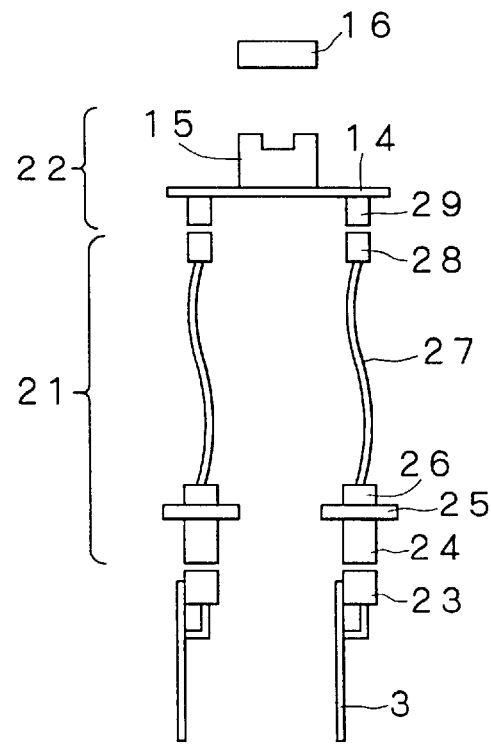
FIG. 1A and FIG. 1B are structural drawings of the present invention.
Figure 2:
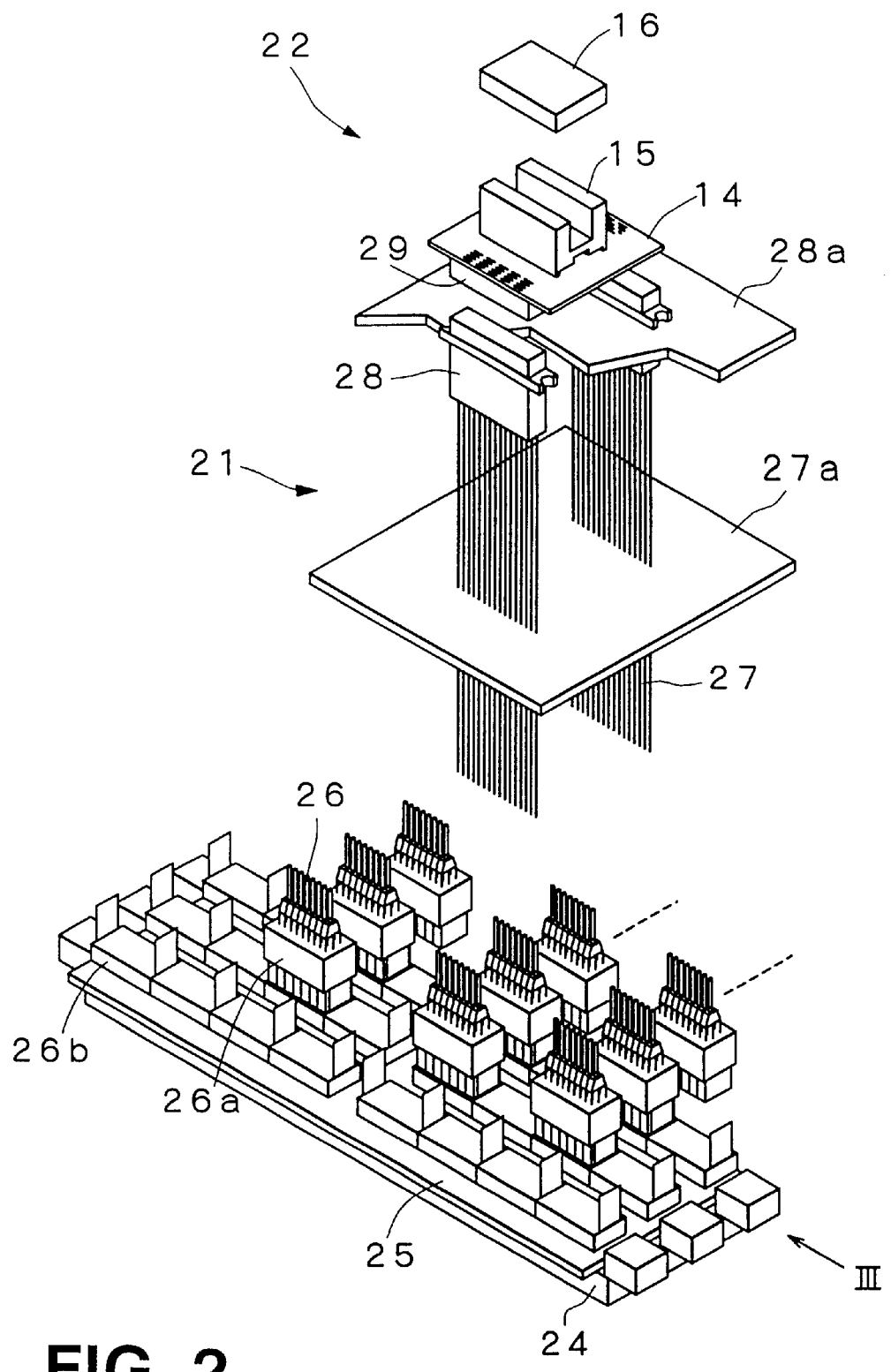
FIG. 2 is a perspective drawing showing an Embodiment of the present invention.
Figure 3:
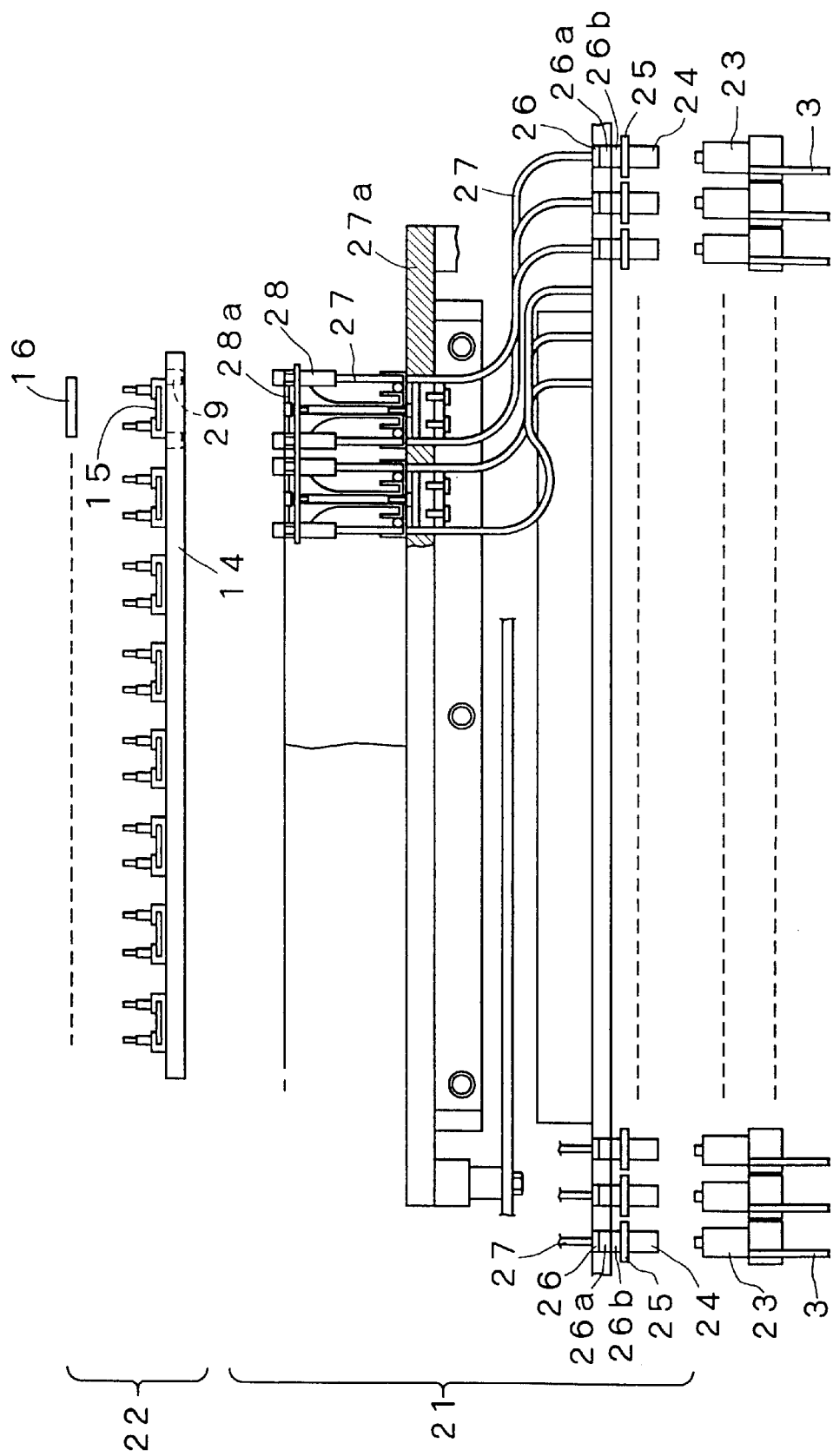
FIG. 3 is a diagram of the Embodiment shown in FIG. 2 as seen from the direction indicated by arrow III.
Figure 4A:
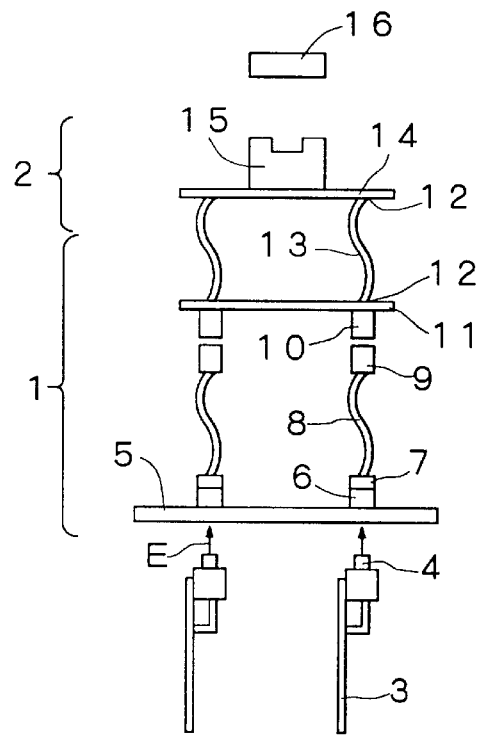
FIG. 4A and FIG. 4B are structural diagram of conventional art.
Figure 4B:
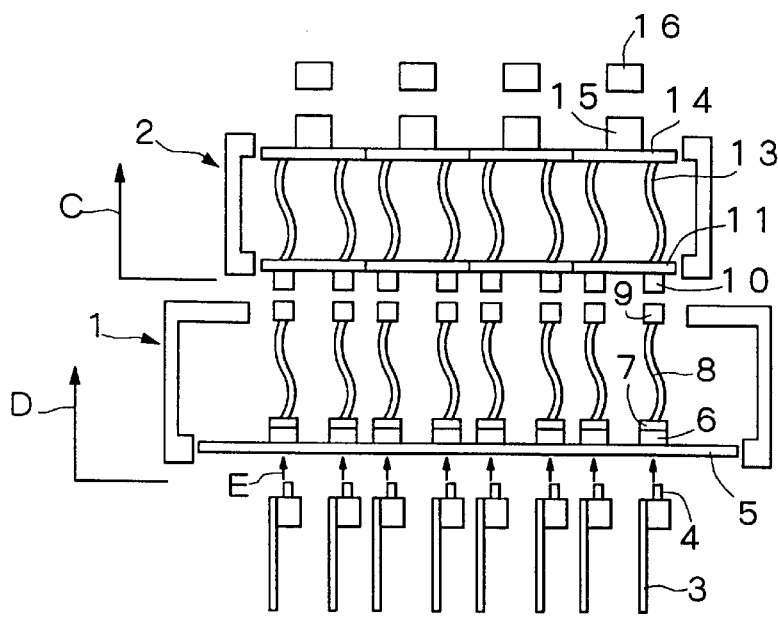
Figure 5:
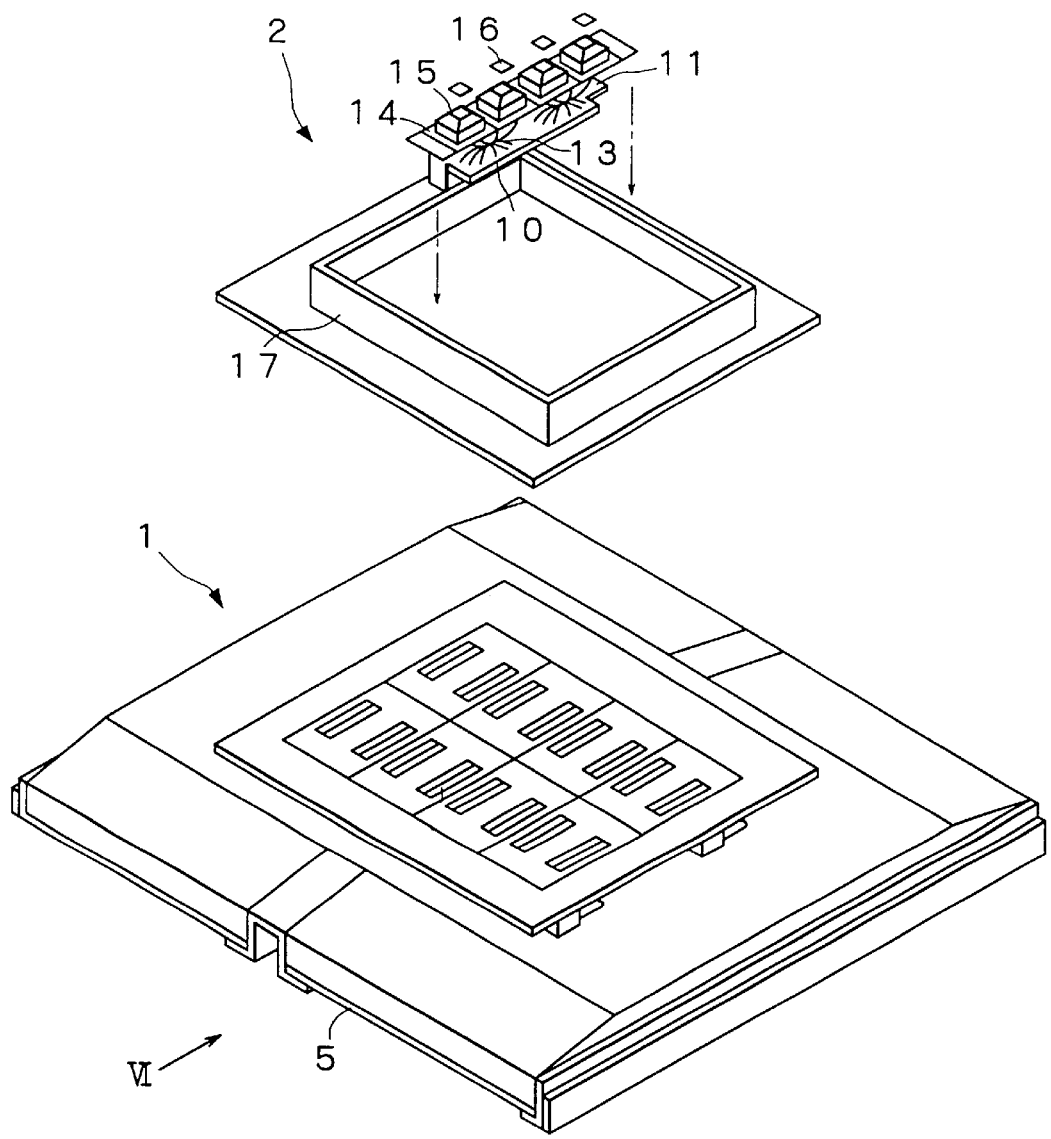
FIG. 5 is a structural diagram of conventional art.
Figure 6:
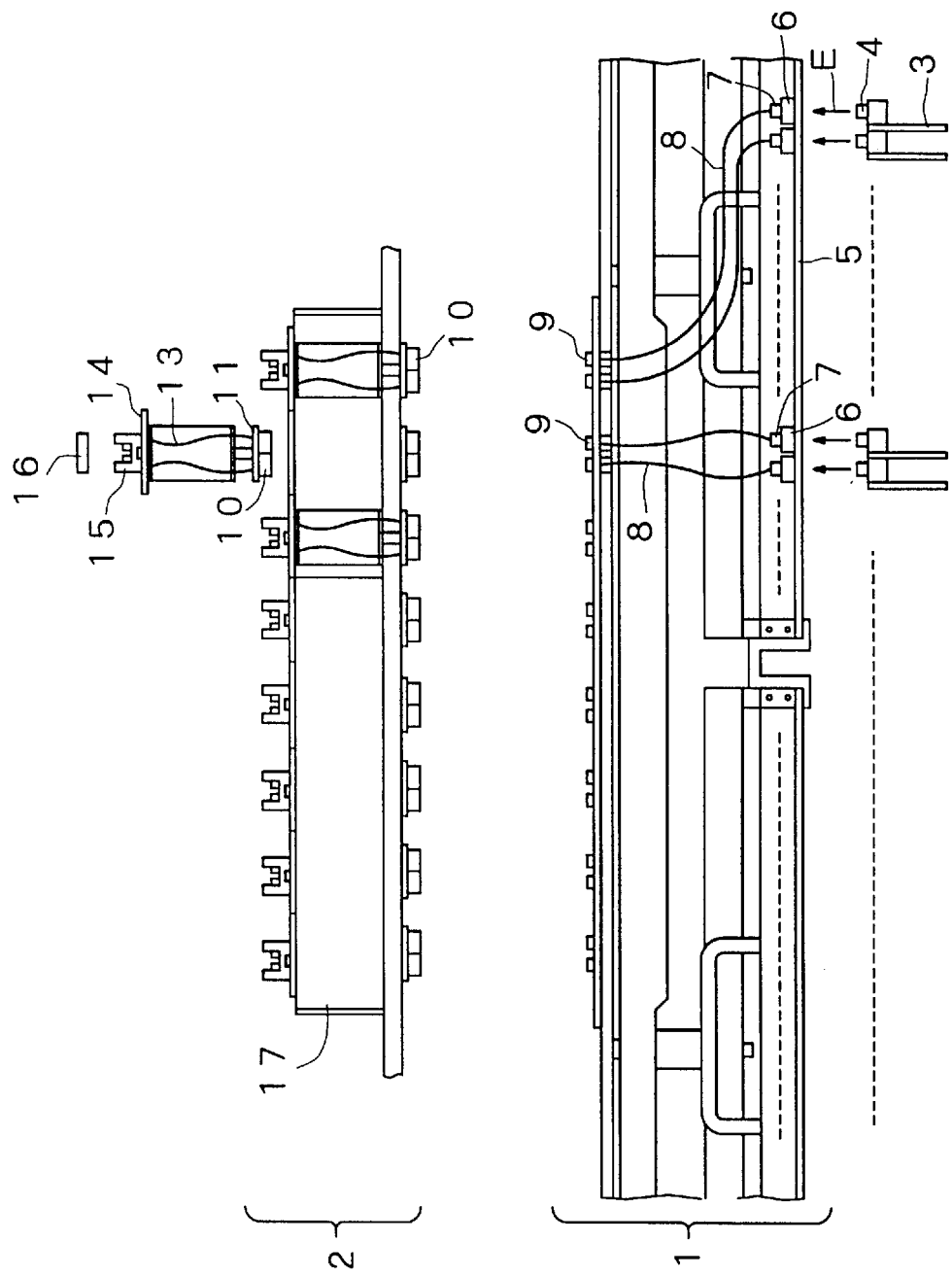
FIG. 6 is a diagram of the conventional art shown in FIG. 5 as seen from the direction indicated by arrow VI.

FIG. 1 is a structural diagram of the present invention. FIG. 2 is a perspective view of the present invention. FIG. 3 is a diagram of the present invention as seen from the direction of arrow III in FIG. 2. In FIGS. 1 through 3, number 21 indicates a base unit, number 22 indicates a DUT unit, number 3 indicates a pin card, number 23 indicates a fifth connector, number 24 indicates a sixth connector, number 25 indicates a base card, number 26 indicates seventh connector, number 27 indicates a cable harness, number 28 indicates an eight connector, number 29 indicates a ninth connector, number 14 indicates a socket board, number 15 indicates an IC socket, and number 16 indicates a device being tested.

A test circuit (omitted from the Figure) for testing the device 16 being tested is loaded on pin card 3 and fifth connector 23 which is connected to the test circuit is mounted on pin card 3. The fifth connector 23 of pin card 3 engages sixth connector 24 which opposes fifth connector 23. Sixth connector 24 is mounted on the lower surface of base card 25. In addition, base card 25 is divided so that there is one base card 25 per sixth connector 24 mounted on base card 25. In other words, base card 25 is divided into separate sections, one for each sixth connector 24.

As shown in FIG. 2 and FIG. 3, cable harness 27 has seventh connector 26 and eight connector 28 at respective ends and passes through insulation 27a. It is possible to change the connection destination by means of changing the connection of seventh connector 26 which is at one end of cable harness 27 with connector housings 26a shown in FIG. 2, and thereby it is possible to change the arrangement of the connecting signal. In addition, the above-mentioned connector housings 26a are guided by the post housings 26b which are provided on each of the base cards 25 in such a way as to prevent them being pulled out.

In addition, base unit 21 comprises the above-mentioned sixth connector 24, base cards 25 which are divided one for each sixth connector 24, and cable harness 27 for which the connection destination can be changed by means of seventh connector 26.

The eighth connector 28 of the other end of cable harness 27 is fitted to fixed insulation 28a (FIG. 2 and FIG. 3). Eighth connector 28 engages ninth connector 29 which is mounted to socket board 14. IC socket 15 is mounted on socket board 14 and is connected to the above-mentioned ninth connector 29 via a pattern, and device 16 which is being measured and which is the test object of IC socket 15 is mounted on IC socket 15. In addition, the DUT unit 22 comprises the above-mentioned ninth connector 29, and socket board 14 on which ninth connector 29 is mounted.

In the following, the effects of the present invention having the above-described structure are explained.

(1) Separation and exchange of the DUT unit 22 and correspondence for different varieties of device 16 being measured The DUT unit 22 which comprises the socket board 14 can be separated between the eighth connector 28 and the ninth connector 29 (as indicated by the arrow A in FIG. 1B) and replaced with a new DUT unit 22. In this case, since the DUT unit 22 comprises only the socket board 14, it is extremely small and light, in addition, construction is easy. Consequently, separation and replacement of the DUT unit 22 from the base unit 21 can be done simply. In addition, correspondence with various different devices 16 being tested can be achieved by means of socket boards 14 which have different patterns.

(2) Maintenance of base unit 21

Figure 1B:
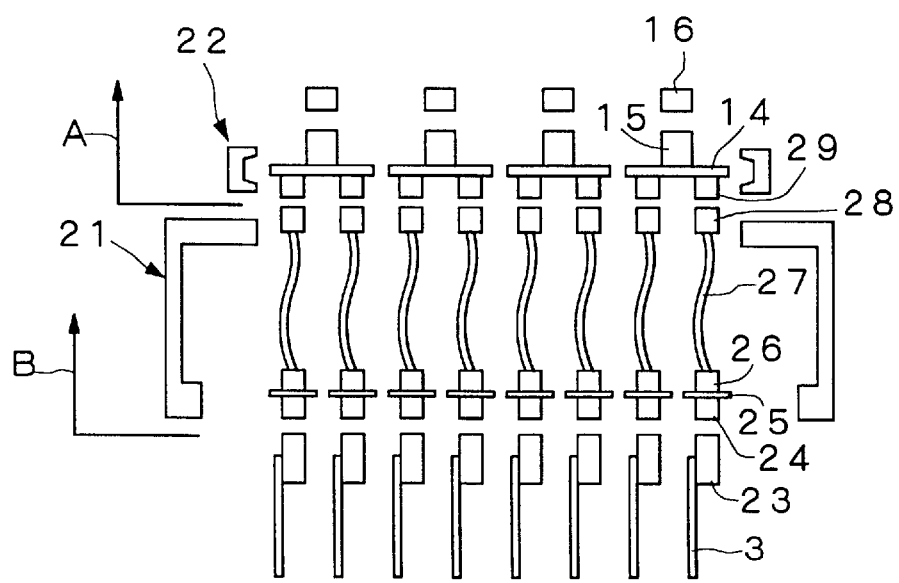

Base unit 21 comprises divided base card 25, and can be separated between sixth connectors 24 which are mounted on each of base card 25 and fifth connector 23 (as indicated by the arrow B in FIG. 1B).

Consequently, by means of removing from the separated base unit 21 only those base cards 25 on which sixth connectors 24 which need to be replaced are mounted, it is possible to substitute new sixth connectors 24, and maintenance is extremely easy.

(3) Reliability and transmittability of high frequency signals

Only cable harness 27 is connected between socket board 14 and pin card 3 and there is no pogo pin 4 or solder connection 12. Therefore, connection points are reduced, and it is possible to realize high speed transmission of signals between pin card 3 and the device 16 being tested. For this reason, the reliability and transmittability of high frequency signals through connection points is improved.

(4) Signal arrangement change

In addition, by means of changing the connection of the seventh connector 26 of the above-mentioned cable harness 27, which is connected between pin card 3 and the device 16 being tested, to the relevant connector housing 26a, it is possible to change the connection destination.

In the above-mentioned way, according to the present invention, the base unit 21 of the test board for an IC tester comprises sixth connector 26 which engages fifth connector 23 which is mounted on pin card 3, base card 25 on which sixth connector 24 is mounted and which is divided into sections one for each sixth connector 24, and cable harness 27 which has seventh connector 26 and eighth connector 28 on respective ends and for which the connection destination in which seventh connector 26 engages sixth connector 24 which is mounted on the above-mentioned base card 25 is changeable. In addition, the DUT unit 22 comprises socket board 14 containing IC socket 15 and on which ninth connector 29 which engages eighth connector 28 of cable harness 27 is mounted. By means of this structure, effects such as the simplification of the separation and exchange of the DUT unit and correspondence for different varieties of device 16 being measured, the improvement of the maintainability of the base unit, the improvement of the reliability and transmittability of high frequency signals at connection points, and the ability to change the arrangement of connecting signals are obtained.

What is claimed is:

1. A testboard to provide an interface between an IC device being tested by test signals and an IC tester having a pin card, said testboard comprising:

a base unit comprising a plurality of base cards, each said base card producing the test signals for the IC device and each having a connecting part to provide connection to the pin card;

a plurality of cable harnesses, each harness having a detachable type first connector on one of its ends for connection to the connecting part of a selected one of said plurality of base cards to allow the change of test signals to be supplied to the IC device by changing the connection destination of a said first connector of a said cable harness, each harness also having a detachable type second connector on the other of its ends;

a DUT unit comprising a socket board with a socket for accepting the IC device to be tested and including a plurality of connectors each for accepting connection of a said second connector at the other end of any one of said plurality of cable harnesses.

2. A testboard as in claim 1 wherein a said base card further comprises a post housing which is provided on said connecting part of said base card and a connector housing which is inserted into said post housing, and a connection destination of said first connector of a said cable harness is changed by changing the connection between said connector housing and said first connector.

* * * * *